United States Patent [19]

Asada et al.

[11] Patent Number: 6,007,743
[45] Date of Patent: Dec. 28, 1999

[54] NICKEL POWDER AND PROCESS FOR PREPARING THE SAME

[75] Inventors: Eiichi Asada, Tokyo; Yuji Akimoto, Fukuoka; Kazuro Nagashima, Ohnojo; Hiroshi Yoshida, Ohnojo; Yiyi Ma, Ohnojo, all of Japan

[73] Assignee: Shoei Chemical, Inc., Tokyo, Japan

[21] Appl. No.: 09/024,397

[22] Filed: Feb. 17, 1998

[30] Foreign Application Priority Data

Oct. 17, 1997 [JP] Japan ................................. 9-299638

[51] Int. Cl.$^6$ ............................... H01B 1/02; H01B 1/06; B32B 5/16; H05K 1/09
[52] U.S. Cl. .................. 252/513; 252/520.2; 174/257; 174/126.2; 428/403; 428/407
[58] Field of Search ................... 252/512, 520.2; 428/403, 407; 174/126.2, 257

[56] References Cited

U.S. PATENT DOCUMENTS

| | | |
|---|---|---|
| 4,814,107 | 3/1989 | Steinberg . |
| 5,439,502 | 8/1995 | Kodas et al. ............................. 75/365 |
| 5,871,840 | 2/1999 | Asada et al. ............................. 428/328 |

FOREIGN PATENT DOCUMENTS

| | | |
|---|---|---|
| 0 487 272 A2 | 5/1992 | European Pat. Off. . |
| 0 593 167 A1 | 4/1994 | European Pat. Off. . |
| 63-31522 | 1/1987 | Japan . |
| 6-279816 | 10/1994 | Japan . |

OTHER PUBLICATIONS

"Preparation of fine Ni particles by the spray–pyrolysis technique and their film forming properties in the thick film method", K. Nagashima et al, Journal of Materials Research, Dec., 1990, USA, vol. 5, No. 12, pp. 2828–2834.

*Primary Examiner*—Mark Kopec
*Assistant Examiner*—John M Petruncio
*Attorney, Agent, or Firm*—Flynn, Thiel, Boutell & Tanis, P.C.

[57] ABSTRACT

A nickel powder having at at least part of the surface thereof a layer of a composite oxide represented by the formula: $A_xB_yO_{(x+2y)}$, wherein A stands for at least one element selected from the group consisting of Ca, Sr and Ba; B stands for at least one element selected from the group consisting of Ti and Zr; and x and y represent numbers satisfying the formula: $0.5 \leq y/x \leq 4.5$). The nickel powder may further contains at least one selected from among boron oxide, aluminum oxide and silicon oxide. The nickel powder is produced by spray pyrolyzing a solution of thermal decomposable starting compounds of nickel and additive elements and the resultant powder is suitable for use in a thick-film conductor paste having a sintering-starting temperature close to that of ceramic layers and a shrinkage behavior close to that of a ceramic without detriment to the conductivity and electric properties thereof.

8 Claims, No Drawings

NICKEL POWDER AND PROCESS FOR PREPARING THE SAME

BACKGROUND OF THE INVENTION

1. Field of the Invention

The present invention relates to a novel nickel powder suitable for use in a thick-film conductor paste and a process for preparing the same, and further relates to a conductor paste prepared using this nickel powder and multilayer electronic components having conductor layers formed using this paste.

2. Description of the Prior Art

Thick-film pastes such as a conductor paste and a resistor paste are used in order to produce components such as an electric circuit, a resistor, a capacitor and an IC package in the electronics field. They are pastes prepared by homogeneously mixing and dispersing a conductive powder of a metal, an alloy, a metal oxide or the like, if necessary, together with a vitreous binder and other additive(s) in an organic vehicle, and they are respectively formed into a conductor film and a resistor film by applying the same onto a substrate and then firing at a high temperature.

Ceramic multilayer electronic components, such as a multilayer capacitor and a multilayer inductor, and ceramic multilayer substrates are generally produced by laminating a plurality of unfired ceramic green sheets of a dielectric material, a magnetic material or the like alternately with a plurality of layers of an inner conductor paste, and then simultaneously firing them at a high temperature. As the mainstream inner conductors, noble metals such as palladium, silver-palladium, and platinum have hitherto been used. In aspects of saving resources and satisfying the requirement of improvements in respect of delamination, cracking, etc. attributed to the oxidative expansion of palladium or silver-palladium during firing thereof, however, base metal materials such as nickel have recently attracted attention.

In these multilayer components and multilayer substrates, there is a tendency to increase the number of layers to be laminated. For example, a multilayer capacitor having hundreds of laminated layers has come to be produced. In view of this, ceramic layers and accordingly inner conductor layers are required to be made in the form of a thinner film. For example, when the thickness of a ceramic layer is reduced to about 3 μm, the thickness of an inner conductor layer must be reduced to at most 1 μm, desirably about 0.5 μm, because otherwise the middle portion of the resulting laminate is so thickened as to cause structural defects and lowered reliability.

In the case of a conductor paste prepared using an ordinary nickel powder, however, there is a limit for the formation of thinner films therefrom because it poses not only such a problem that the resulting inner conductor yields a discontinuous film due to oversintering in the course of firing and thus increases the resistance value or undergoes disconnection, but also such a problem that the thickness of the conductor increases as a result of the aggregation of the nickel powder. More specifically, the nickel powder, when fired in an inert atmosphere or in a reducing atmosphere particularly for the purpose of preventing oxidation thereof, is quickly sintered and begins to sinter and shrink at a temperature as low as 400° C. or below even when it is a single crystal powder comparatively low in activity. On the other hand, the sintering-starting temperature of a ceramic layer is generally far higher than that temperature. For example, it is about 1,200° C. for barium titanate, which therefore does not shrink together with nickel films even by co-firing and allows the nickel films to be pulled in the face direction. Thus, it is conceivable that small voids formed in the nickel films by sintering at a comparatively low temperature are expanded in keeping with the progress of sintering in a higher temperature region and tend to become large, while the films are liable to grow in the thickness-wise direction thereof due to the aggregation of the nickel powder.

In order to make nickel inner conductor layers thinner, therefore, it is thought necessary to render a nickel powder so fine and better in dispersibility as to hinder the formation of voids in the course of firing, and to make the sintering shrinkage behavior of these layers agree with that of ceramic layers.

The disagreement in sintering shrinkage behavior between the conductor layers and the ceramic layers is so causative of structural defects such as delamination and cracking as to lower the yield and the reliability particularly when the films are thick.

Various investigations have hitherto been made for the purpose of suppressing the sintering of a conductor till the sintering-starting temperature of ceramic layers. For example, the addition of a large amount of a ceramic powder having the same composition as that used in ceramic layers can retard apparent shrinkage of conductor layers up to around 800° C. Since the sintering of a metal powder itself is not suppressed, however, the continuity and conductivity of conductor layers are consequently spoiled when firing is conducted at a temperature as high as about 1,300° C.

SUMMARY OF THE INVENTION

An object of the present invention is to provide conductor films with high conductivity even in the case of a thin film by effectively suppressing the sintering of a nickel powder at a low temperature.

Another object of the present invention is to allow the sintering-starting temperature of a nickel powder to be as close as possible to the sintering-starting temperature of ceramic layer without detriment to the conductivity of the conductor and the electric properties of components when the powder is used in a conductor paste to be co-fired with unfired ceramic layers for use in multilayer electronic components and the like, whereby the shrinkage behavior thereof can closely resemble that of a ceramic and thus prevents the disconnection and structural defects of conductor films while minimizing the film thickness thereof.

Still another object of the present invention is to provide a simple and excellent process for preparing such a nickel powder.

The gist of the present invention resides in a nickel powder having at at least part of the surface thereof a layer of a composite oxide represented by the formula (1):

$$A_xB_yO_{(x+2y)} \tag{1}$$

(wherein A stands for at least one element selected from the group consisting of Ca, Sr and Ba; B stands for at least one element selected from the group consisting of Ti and Zr; and x and y represent numbers satisfying the formula: $0.5 \leq y/x \leq 4.5$).

The nickel powder may further contains at least one selected from the group consisting of boron oxide, aluminum oxide and silicon oxide.

Another gist of the present invention resides in a process for preparing the foregoing nickel powder, comprising forming fine droplets from a solution containing (a) at least one thermally decomposable nickel compound, (b) at least one selected from the group consisting of thermally decomposable calcium, strontium and barium compounds, and (c) at least one selected from the group consisting of thermally decomposable titanium and zirconium compounds; heating the droplets at a temperature higher than the decomposition temperatures of the nickel compound, the calcium compound, the strontium compound, the barium compound, the titanium compound or the zirconium compound to form a nickel powder while simultaneously precipitating a layer of a composite oxide represented by the above-mentioned formula (1) in the vicinity of the surface of the nickel powder.

Still another gist of the present invention resides in a process for preparing the nickel powder containing as a further additive at least one selected from the group consisting of boron oxide, aluminum oxide and silicon oxide, the process comprising forming fine droplets from a solution containing (a) at least one thermally decomposable nickel compound, (b) at least one selected from the group consisting of thermally decomposable calcium, strontium and barium compounds, (c) at least one selected from the group consisting of thermally decomposable titanium and zirconium compounds, and (d) at least one selected from the group consisting of thermally decomposable boron, aluminum and silicon compounds; heating the droplets at a temperature higher than the decomposition temperatures of the nickel compound, the calcium compound, the strontium compound, the barium compound, the titanium compound, the zirconium compound, the boron compound, the aluminum compound or the silicon compound to form a nickel powder while simultaneously precipitating a layer of a composite oxide represented by the above-mentioned formula (1) and at least one of boron, aluminum and silicon oxides in the vicinity of the surface of the nickel powder.

Further gists of the present invention reside in a conductor paste containing at least one of the foregoing nickel powders, and a ceramic multilayer electronic component having a conductor layer formed using the conductor paste.

The present invention will now be described in detail.

DETAILED DESCRIPTION OF THE PREFERRED EMBODIMENT

The composite oxide of the formula (1), which may be in any of the forms of covering the surface of the nickel powder and of being segregated at a high concentration on the surface and/or in the vicinity of the surface of the nickel powder, must exist in the vicinity of the surface of the nickel powder in such a way as to be effective in hindering the sintering of the nickel powder. Although a powder with its surface covered wholly is thought to be most effective in preventing nickel metal particles from coming into mutual contact, a powder with its surface not necessarily covered wholly will suffice in so far as an effective amount of the composite oxide exists in the vicinity of the surface of the powder as required by the use, firing atmosphere, necessary characteristics, etc., thereof.

The principal phase of the layer of the composite oxide is a phase represented by the formula (1). The nickel powder having this oxide on the surface thereof is suppressed in sinterability in a low temperature region, thus enabling the sintering thereof to be retarded up to around the sintering-starting temperature of a ceramic while preventing the oversintering thereof though it depends on the amount of the oxide. This serves to prevent an increase in the resistance of the conductor, disconnection thereof, an increase in film thickness, delamination, etc., which are attributed to the disagreement between the shrinkages of the conductor layers and the ceramic layers in the course of co-firing thereof, whereby a thin nickel conductor having good conductivity and adhesion can be formed. This enables conductor layers in a multilayer component or the like to be made in the form of a thinner film.

When the nickel powder is co-fired with ceramic dielectric green sheets made of a titanate, such as barium titanate or strontium titanate, or a zirconate, the sintering behavior thereof is more close to that of the dielectric layer and scarcely affects the electric properties of the dielectric layer since the composition of the composite oxide is similar to that of the dielectric.

The constituent element A to B atomic ratio of the composite oxide must be in the range of 2:1 to 1:4.5 because the properties of the dielectric are sometimes spoiled if it departs too far from the ratio of 1:1. It is practically desired to be in the range of 2:1 to 1:2. It is to be noted that the ratio of each of A and B to oxygen may not necessarily be stoichiometric, but may involve an insufficiency of oxygen like titanate or like dielectric ceramics generally used. Oxides of a variety of elements such as manganese, magnesium, vanadium, tungsten and rare earth elements usually doped for the purpose of controlling the characteristics of titanate or the like may appropriately be doped in accordance with the composition of the ceramic dielectric layer.

Although the composite oxide is effective even in an amount as small as about 0.1 wt. % based on nickel, the amount of the composite oxide is desired to be at least 1 wt. %. Even if it is too large, any great improvement in the sintering-suppressing effect cannot be expected and the conductivity of the powder is lowered in keeping with a decrease in the proportion of nickel. Thus, it is practically up to about 50 wt. %.

Boron oxide, aluminum oxide and silicon oxide can not only enhance the effect of retarding the initiation of sintering, but also is effective in suppressing the oxidation of the nickel powder, whereby an organic component in the paste can be burned and removed without oxidation of nickel even in an atmosphere having a comparatively high oxygen concentration. Particularly when the powder of the present invention is prepared by the spray pyrolysis method as will be described later, it is conceivable that these oxides can work as a flux for lowering the melting point of the composite oxide formed at a high temperature and lowering the viscosity of the melt to improve the efficiency of the oxide covering the surface of the nickel powder so as to be able to attain the uniformity of covering. They can play the role of a binder through precipitation thereof in an amorphous state in the grain boundaries of the composite oxide layers when cooled.

The amounts of boron oxide, aluminum oxide and silicon oxide (hereinafter referred to as the "binder component"), if too large, exert great influences on the electric properties of dielectrics and the like, and are therefore desired to be up to about 20 wt. % in total based on nickel.

The composite oxide layers may be formed by any method, examples of which include a method wherein a calcium compound and the like are attached onto the surface of a nickel powder according to wet processes such as the sol-gel process and then calcined to form composite oxide layers, a method wherein they are formed by spray pyrolysis, and a method wherein a composite oxide is mechanically mixed with and attached to a nickel powder.

The powder of the present invention is desirably prepared by the spray pyrolysis method. This method comprises atomizing a solution containing at least one metal compound to form fine droplets and heating the droplets at a temperature higher than the decomposition temperature of the metal compound, desirably at a temperature close to or not lower than the melting point of the metal, to effect thermal decomposition of the metal compound to thereby precipitate a metal or alloy powder as disclosed in Japanese Patent Publication No. 31,522/1988, Japanese Patent Laid-Open No. 279,816/1994, etc.

According to this method, a nickel powder having a good crystallinity, a high density and a high dispersibility can be obtained with easy control of the particle size thereof, and the addition of compounds of the constituent elements of the composite oxide, such as a calcium compound, to a solution of a nickel compound as the starting material can advantageously provide the nickel powder of the present invention having composite oxide layers by one operation without necessitating any additional covering step. More specifically, it is conceivable that oxides of calcium and the like precipitated through pyrolysis are expelled toward the surfaces of nickel particles due to a good crystallinity of the resulting nickel particles to form the composite oxide in the vicinity of the surface. In this case, the interface of bonding of the nickel particles with the composite oxide is presumed to form a gradient-composition structure comprising metal and ceramic. Thus it may become possible not only to provide strongly bonded layers but also to prevent the degradation of the particle structure due to mismatched thermal expansion coefficients during firing, whereby a stable metal-ceramic bonded structure can be maintained even at a temperature as high as about 1,000° C. so as to work effectively for the prevention of sintering. Moreover, since the composite oxide is comparatively uniformly precipitated on the surface, even a slight amount of it can exert the desired effect. Furthermore, in the spray pyrolysis method, the composition of the resulting particles is basically in agreement with the composition of the starting metal compounds in the solution to make the control of the composition easy. Thus, this method is suitable for the preparation of the nickel powder of the present invention.

When the binder component such as boron oxide is to be contained, the addition of at least one selected from the group consisting of thermally decomposable boron compounds, aluminum compounds and silicon compounds to the solution of the starting material will suffice.

In the process of the present invention, use is made of starting compounds such as a nickel compound, a composite oxide and a binder component, which may each be at least one of thermally decomposable compounds, examples of which include a nitrate, a sulfate, an oxynitrate, an oxysulfate, a chloride, an ammonium complex, a phosphate, a carboxylate, a metal alcoholate, a resinate, a boric acid, and a silicic acid. Alternatively, use may be made of a double salt, a complex salt or a colloidal solution of a metal oxide.

A solution of these metal compounds in water, an organic solvent such as an alcohol, acetone or an ether, or a mixture thereof is formed into fine droplets through an ultrasonic atomizer, a double-fluid nozzle-type atomizer or similar atomizing device, and then heated at a temperature higher than the decomposition temperatures of the metal compounds to effect thermal decomposition thereof. Although the heat treatment is desired to be effected at a temperature equal to or higher than the melting point of nickel, it can exert a sufficient expellant effect even at a temperature lower by about 200° C. than that melting point. Particularly when a high density, a form uniformity, etc. are unnecessary, it may be effected even at a temperature considerably lower than that melting point. Heating is done in an atmosphere substantially incapable of oxidizing the nickel powder, such as a reducing or inert atmosphere, desirably in a weakly reducing atmosphere containing hydrogen, carbon monoxide or the like.

The conductor paste of the present invention containing a nickel powder as the conductive component is prepared by uniformly blending and dispersing it in an organic vehicle according to a customary method. If necessary, it may further contain other conductive powders, inorganic binders such as a glass powder, and other additives.

The nickel powder of the present invention is especially suitable for an inner conductor paste and an outer conductor paste for use in multilayer components such as a multilayer capacitor and a multilayer PTC element wherein use is made of a titanate, zirconate or titanium oxide ceramic, composite components wherein they are incorporated, and composite substrates, but it may be used in other ordinary thick-film conductor pastes.

The following Examples will specifically illustrate the present invention in comparison with Comparative Example.

EXAMPLES 1 TO 5

Nickel nitrate hexahydrate was dissolved in water at a nickel concentration of 50 g/l, and then mixed with barium nitrate and titanyl nitrate to prepare a solution of the starting material in an amount of 0.1 to 20 wt. % in terms of $BaTiO_3$ based on the nickel element as shown in Table 1.

This solution was formed into fine droplets using an ultrasonic atomizer, and then fed together with a weakly reducing gas so adjusted as a carrier into a ceramic tube heated at 1,500° C. in an electric furnace. The droplets were passed through a heating zone, wherein they were thermally decomposed to form a nickel powder containing $BaTiO_3$.

Only nickel and $BaTiO_3$ were detected in the analysis of the obtained powder with an X-ray diffractometer. As a result of fluorescent X-ray analysis, the $BaTiO_3$ content was found to agree with the blending composition of the solution of the starting material. Further, it was observed under a Field Emission-Scanning Electron Microscope (FE-SEM) that $BaTiO_3$ layers were present in the vicinity of the surface of the nickel powder.

Next, the obtained powder was subjected to thermomechanical analysis (TMA) and thermogravimetrical analysis (TG) to evaluate the sintering behavior and oxidation behavior of the powder, the sintering shrinkage-starting temperature and oxidation-starting temperature of which are shown in Table 1.

EXAMPLES 6 AND 7

A nickel powder having on the surface thereof a layer of a composite oxide having the composition as shown in Table 1 was obtained in substantially the same manner as in Example 4 except that the ratio of the barium to the titanium to be added was varied.

The sintering shrinkage-starting temperature and oxidation-starting temperature of the powder that were measured by TMA and TG are also shown in Table 1.

EXAMPLES 8 TO 12

At least one of barium nitrate, calcium nitrate and strontium nitrate, and at least one of titanyl nitrate and zirconyl nitrate were added to an aqueous solution of nickel nitrate. A nickel powder having layers of a composite oxide having the composition as shown in Table 1 was obtained in the same manner as in Example 4.

The sintering shrinkage-starting temperature and oxidation-starting temperature of the powder that were measured by TMA and TG are also shown in Table 1.

EXAMPLES 13 TO 20

Barium nitrate, titanyl nitrate, and one or two of boric acid, aluminum nitrate and colloidal silica were added to an aqueous solution of nickel nitrate. A nickel powder containing a composite oxide and a binder component with respective compositions as shown in Table 1 was obtained in the same manner as in Example 1.

The sintering shrinkage-starting temperature and oxidation-starting temperature of the powder that were measured in the same manner are also shown in Table 1.

It was confirmed by observation under an FE-SEM that the existence of the binder component improved the efficiency of composite oxide layers covering the surfaces of nickel particles with a more uniformity of covering.

COMPARATIVE EXAMPLE 1

A pure nickel powder was obtained in substantially the same manner as in Example 1 except that neither barium nitrate nor titanyl nitrate was added. The sintering shrinkage-starting temperature and oxidation-starting temperature of it are shown in Table 1.

retard the initiation of shrinkage of a nickel paste in the course of firing up to around the sintering-starting temperature of a ceramic. In electronic components such as a multilayer capacitor, therefore, the disconnection and structural defects of conductor films can be prevented since the sintering shrinkage behavior of nickel conductor layers is close to that of ceramic layers. Further, since the composite oxide layers have a dielectric composition, they neither affect dielectric layers nor deteriorate the characteristics of electronic components. Accordingly, high-reliability and high-performance products can be produced. Furthermore, since the thickness of inner conductor layers can be reduced, multilayer electronic components can be further miniaturized with a higher level of integration.

What is claimed is:

1. A nickel powder having at least part of the surface thereof a layer of a composite oxide represented by the formula (1):

$$A_xB_yO_{(x+2y)} \qquad (1)$$

wherein A stands for at least one element selected from the group consisting of Ca, Sr and Ba; B stands for at least one element selected from the group consisting of Ti and Zr; and x and y represent numbers satisfying the formula: $0.5 \leq y/x \leq 4.5$.

2. The nickel powder as claimed in claim 1, which further contains at least one selected from the group consisting of boron oxide, aluminum oxide and silicon oxide.

3. A process for preparing the nickel powder as claimed in claim 1, comprising forming fine droplets from a solution

TABLE 1

| | Composition of Composite Oxide | Amount of Composite Oxide (wt. %) | Binder Component | Amount of Binder Component (wt. %) | Shrinkage-Starting Temp. (° C.) | Oxidation-Starting Temp. (° C.) |
|---|---|---|---|---|---|---|
| Example 1 | BaTiO$_3$ | 0.1 | — | — | 590 | 470 |
| Example 2 | BaTiO$_3$ | 1.0 | — | — | 710 | 470 |
| Example 3 | BaTiO$_3$ | 5.0 | — | — | 980 | 470 |
| Example 4 | BaTiO$_3$ | 10.0 | — | — | 1040 | 470 |
| Example 5 | BaTiO$_3$ | 20.0 | — | — | 1090 | 470 |
| Example 6 | Ba$_2$TiO$_4$ | 10.0 | — | — | 970 | 460 |
| Example 7 | BaTi$_2$O$_5$ | 10.0 | — | — | 980 | 510 |
| Example 8 | Ba$_{0.7}$Ca$_{0.3}$TiO$_3$ | 10.0 | — | — | 1010 | 470 |
| Example 9 | BaTi$_{0.8}$Zr$_{0.2}$O$_3$ | 10.0 | — | — | 1000 | 470 |
| Example 10 | Ba$_{0.5}$Ca$_{0.3}$Sr$_{0.2}$Ti$_{0.8}$Zr$_{0.2}$O$_3$ | 10.0 | — | — | 990 | 470 |
| Example 11 | CaTiO$_3$ | 10.0 | — | — | 1080 | 470 |
| Example 12 | SrTiO$_3$ | 10.0 | — | — | 1090 | 470 |
| Example 13 | BaTiO$_3$ | 10.0 | B$_2$O$_3$ | 0.5 | 920 | 530 |
| Example 14 | BaTiO$_3$ | 5.0 | SiO$_2$ | 0.5 | 980 | 520 |
| Example 15 | BaTiO$_3$ | 10.0 | SiO$_2$ | 0.5 | 890 | 510 |
| Example 16 | BaTiO$_3$ | 10.0 | SiO$_2$ | 0.8 | 1040 | 530 |
| Example 17 | BaTiO$_3$ | 10.0 | SiO$_2$ | 1.0 | 1010 | 560 |
| Example 18 | BaTiO$_3$ | 20.0 | SiO$_2$ | 1.5 | 1020 | 600 |
| Example 19 | BaTiO$_3$ | 50.0 | SiO$_2$ | 3.4 | 1030 | 600 |
| Example 20 | BaTiO$_3$ | 10.0 | SiO$_2$ + Al$_2$O$_3$ | 0.9 + 0.1 | 1080 | 600 |
| Comparative Example 1 | — | — | — | — | 330 | 340 |

As is apparent from Table 1, the nickel powders having composite oxide layers had the shrinkage-starting temperature higher by about 200 to 800° C. than that of pure nickel powder, which began to gradually shrink at about 300° C. The nickel powders further containing a binder component had a higher oxidation-starting temperature.

The nickel powder of the present invention, which is suppressed in the sinterability at a low temperature due to composite oxide layers present at the surface thereof, can containing (a) at least one thermally decomposable nickel compound, (b) at least one selected from the group consisting of thermally decomposable calcium, strontium and barium compounds, and (c) at least one selected from the group consisting of thermally decomposable titanium and zirconium compounds; heating said droplets at a temperature higher than the decomposition temperatures of said nickel compound, said calcium compound, said strontium compound, said barium compound, said titanium compound or said zirconium compound to form a nickel powder while simultaneously precipitating a layer of a composite oxide represented by the formula (1) in the vicinity of the surface of said nickel powder.

4. A process for preparing the nickel powder as claimed in claim 2, comprising forming fine droplets from a solution containing (a) at least one thermally decomposable nickel compound, (b) at least one selected from the group consisting of thermally decomposable calcium, strontium and barium compounds, (c) at least one selected from the group consisting of thermally decomposable titanium and zirconium compounds, and (d) at least one of thermally decomposable boron, aluminum and silicon compounds; heating said droplets at a temperature higher than the decomposition temperatures of said nickel compound, said calcium compound, said strontium compound, said barium compound, said titanium compound, said zirconium compound, said boron compound, said aluminum compound or said silicon compound to form a nickel powder while simultaneously precipitating a layer of a composite oxide represented by the formula (1) and at least one selected from the group consisting of boron oxide, aluminum oxide and silicon oxide in the vicinity of the surface of said nickel powder.

5. A conductor paste containing the nickel powder as claimed in claim 1.

6. The conductor paste as claimed in claim 5, in which said nickel powder further contains at least one selected from the group consisting of boron oxide, aluminum oxide and silicon oxide.

7. A ceramic multilayer electronic component having a conductor layer formed using the conductor paste containing the nickel powder as claimed in claim 1.

8. A ceramic multilayer as claimed in claim 7 in which said nickel powder further contains at least one selected from the group consisting of boron oxide, aluminum oxide and silicon oxide.

* * * * *